United States Patent [19]

Sugayama

[11] Patent Number: 5,203,031
[45] Date of Patent: Apr. 13, 1993

[54] AM RADIO RECEIVER WITH IMPROVED TRACKING

[75] Inventor: Sakae Sugayama, Ora, Japan

[73] Assignee: Sanyo Electric Co., Ltd., Osaka, Japan

[21] Appl. No.: 605,837

[22] Filed: Oct. 30, 1990

[30] Foreign Application Priority Data

Oct. 31, 1989 [JP] Japan .................... 1-283903

[51] Int. Cl.$^5$ .............................. H04B 1/16
[52] U.S. Cl. .................. 455/182.1; 455/164.1; 455/185.1; 455/192.1
[58] Field of Search .......... 455/164, 179, 182-185, 455/192, 197, 150, 160, 168, 164.1, 150.1, 160.1, 182.1, 183.1, 184.1, 185.1, 192.1, 197.1, 1797.1, 168.1

[56] References Cited

U.S. PATENT DOCUMENTS

| 4,405,947 | 9/1983 | Tults et al. ............... 358/193.1 |
| 4,422,096 | 12/1983 | Henderson ............... 358/191.1 |
| 4,426,734 | 1/1984 | Tults et al. ............... 455/180 |
| 4,575,761 | 3/1986 | Carlson et al. ............ 358/191.1 |
| 4,776,038 | 10/1988 | Testin et al. ............. 455/182 |

FOREIGN PATENT DOCUMENTS 0057324 5/1981 Japan .

Primary Examiner—Reinhard J. Eisenzopf
Assistant Examiner—Chi H. Pham
Attorney, Agent, or Firm—Darby & Darby

[57] ABSTRACT

An AM radio receiver includes an automatic tuning circuit for setting an automatic tuning mode. A radio frequency circuit produces a tuned signal and an untuned signal. A selector receives the tuned signal and untuned signal, and selects the tuned signal when the automatic tuning mode is set, and selects the untuned signal when the automatic tuning mode is not set. An intermediate frequency signal generator produces an intermediate frequency signal based on the selected signal.

6 Claims, 3 Drawing Sheets

AM RADIO RECEIVER WITH IMPROVED TRACKING

BACKGROUND OF THE INVENTION

1. Field of the Invention

The present invention relates to an AM radio receiver, and particularly to an AM radio receiver with no tracking error.

2. Description of the Prior Art

AM radio receivers which receive an AM broadcast wave (RF signal) transmitted from a broadcast station are known as described on page 73 in the 1988 "Sanyo Semiconductor Data Book, bipolar integrated circuits for car audio".

An example of a prior art AM radio receiver is shown in FIG. 2, which comprises: an antenna damping circuit 2 which attenuates the RF signal received by the antenna 1; an RF amplifier 5 including an FET 3 which amplifies the RF signal and an AGC transistor 4 having the base thereof applied with an AGC signal; an RF tuning circuit 6; a mixing circuit 8 which mixes an RF signal obtained from the RF tuning circuit 6 and a local oscillation signal obtained from the local oscillation circuit 7; an IF (intermediate frequency) amplifier 9 which amplifies the IF signal obtained from the mixing circuit 8; and an AM detector 10 which detects the output signal of the IF amplifier 9 by the amplitude demodulation.

However, according to the prior art AM radio receiver as thus described, the resonance frequency of the RF tuning circuit 6 and the resonance frequency of the local oscillation circuit 7 must be designed to have a difference equal to the frequency (450 kHz) of the IF signal. Usually, in the prior art AM radio receiver, of all the received frequency band (e.g., from 522 kHz to 1602 kHz), the frequency adjustment is made only at the tracking points (e.g., 600 kHz and 1400 kHz). Thus, at other frequencies the frequency difference is not precisely equal to 450 kHz.

Thus, in the prior art AM radio receiver, there have been observed such a disadvantage that a drop in gain of the RF amplifier is induced. Furthermore, in a stereo AM radio receiver, such a drop in gain is accompanied by a deterioration in separation. Also, during automatic tuning, variations in the stopping sensitivity may also occur. These problems are particularly pronounced at frequencies (522 kHz 600 kHz) lower than the first tracking point (600 kHz) and at frequencies (1400 kHz–1602 kHz) higher than the second tracking point (1400 kHz).

The untuned AM radio receiver as shown in FIG. 3 has been proposed as one means for solving these problems. In FIG. 3 the RF signal amplified by the FET 3 is applied to a first mixing circuit 8 in an untuned state from the collector of the AGC transistor 4. In the first mixing circuit 8, the RF signal and the output signal of the local oscillation circuit 7 are mixed, and a first IF signal of 10.7 MHz is generated at the output terminal of the first mixing circuit 8. Then the first IF signal is mixed with the output signal of the second local oscillation circuit 12 by the second mixing circuit 11, and a second IF signal of 450 kHz is generated at the output terminal of the second mixing circuit 11. The AM radio receiver as shown in FIG. 3 increases selectivity with this double conversion, and is able to eliminate tracking error because it has no RF tuning circuit. Furthermore, image interference is extremely low because the first IF signal frequency is set at 10.7 MHz.

Problem to be solved

However, because the double conversion AM radio receiver as shown in FIG. 3 does not have an RF tuning circuit, there is such a problem that all signals within the reception signal band, including interference signals, are applied to the first mixing circuit 11, and interference signal characteristics, and particularly cross modulation interference characteristics, are significantly deteriorated.

SUMMARY OF THE INVENTION

The present invention has been developed with a view to substantially solving the above described disadvantages and has for its essential object to provide an improved AM radio receiver.

In order to achieve the aforementioned objective, the AM radio according to the present invention is characterized by an RF circuit which generates a tuned signal and an untuned signal, a selector which selectively applies to the mixing circuit one of the output signals from the RF circuit, and a detector which detects whether the AM radio receiver is in an automatic tuning state.

An AM radio receiver according to the present invention during automatic tuning generates a first output signal from the detector, drives the selector by said first output signal, and applies an untuned signal to the mixing circuit. Thus, automatic tuning is accomplished using an untuned signal, and tracking error can be eliminated.

Furthermore, at times other than during automatic tuning, e.g., when tuned, the selector selects the tuned signal and applies this signal to the mixing circuit because a second output signal is output from the detector. Thus, during a tuned state/ reception by the RF tuning circuit is possible using a band restricted RF signal, and interference characteristics, including cross modulation, can be improved.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which.

DESCRIPTION OF PREFERRED EMBODIMENTS

Figure 1:
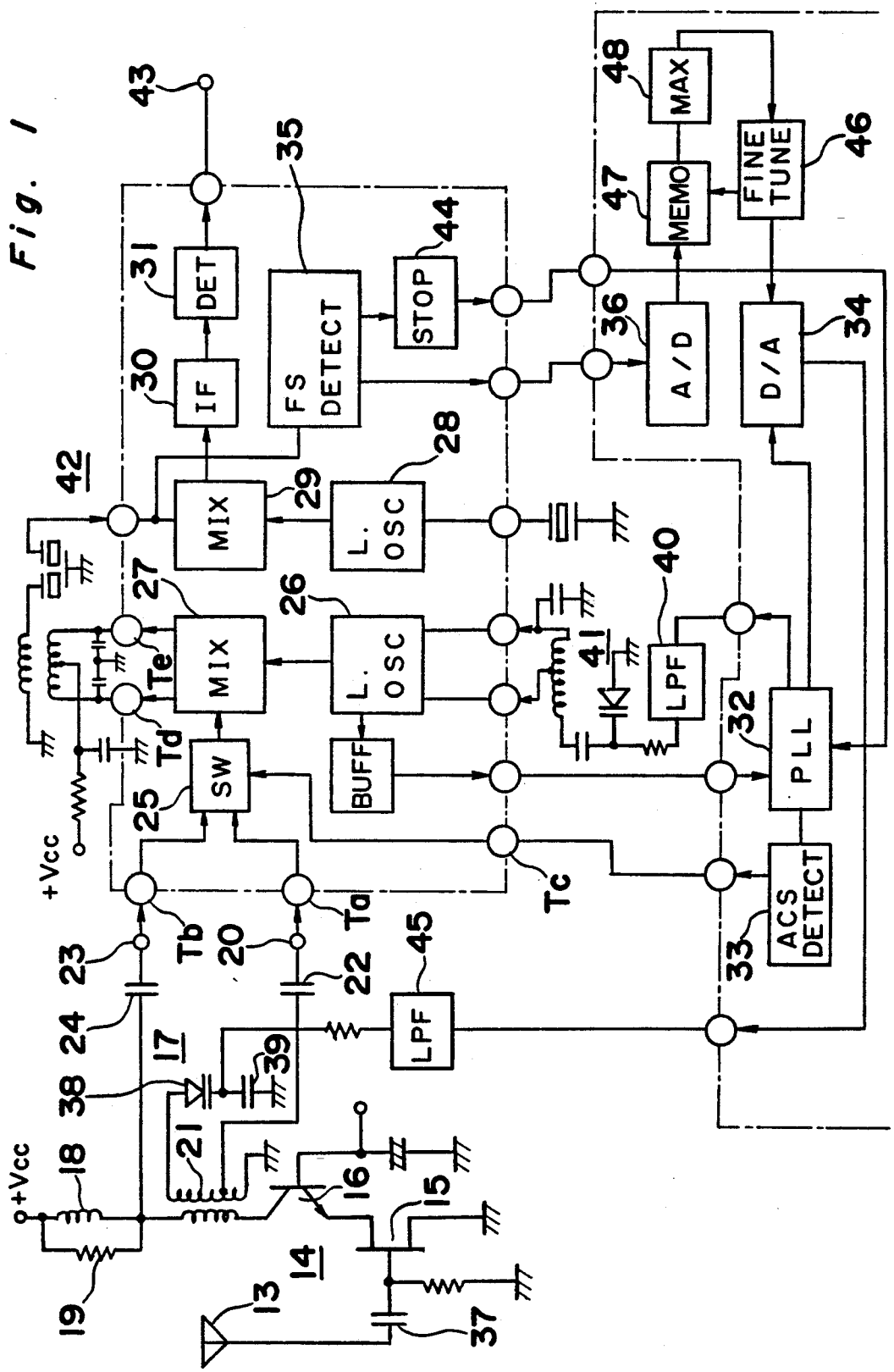
FIG. 1 is a block diagram of an AM radio receiver according to a preferred embodiment of the present invention.
Figure 2:
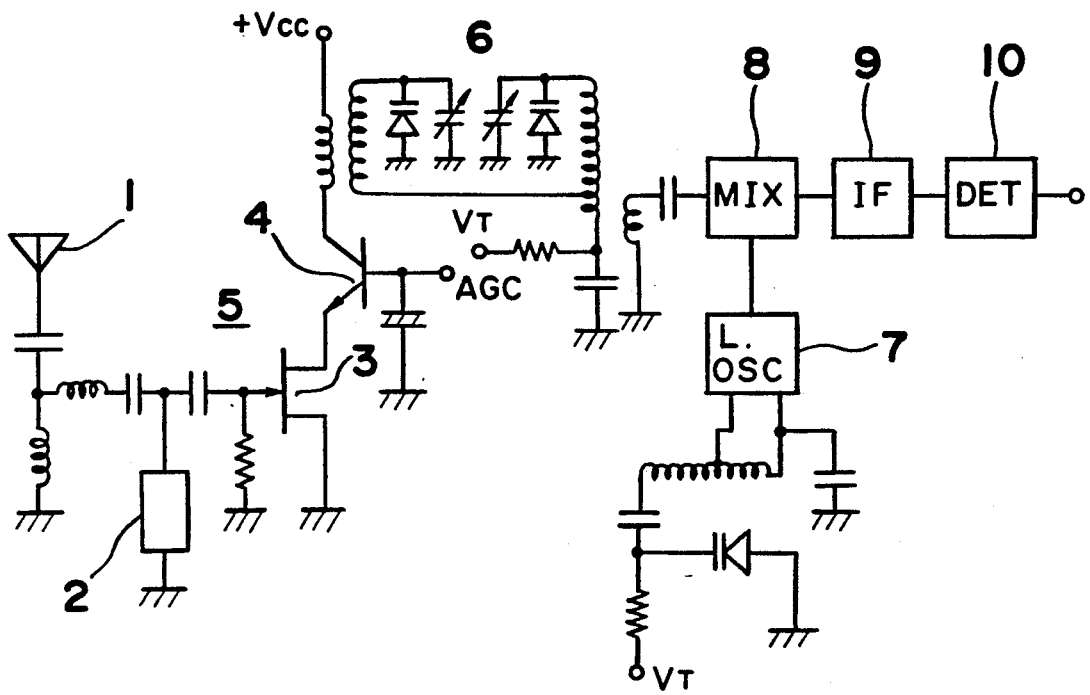
FIG. 2 and FIG. 3 are block diagrams of a prior art AM radio receiver.
Figure 3:
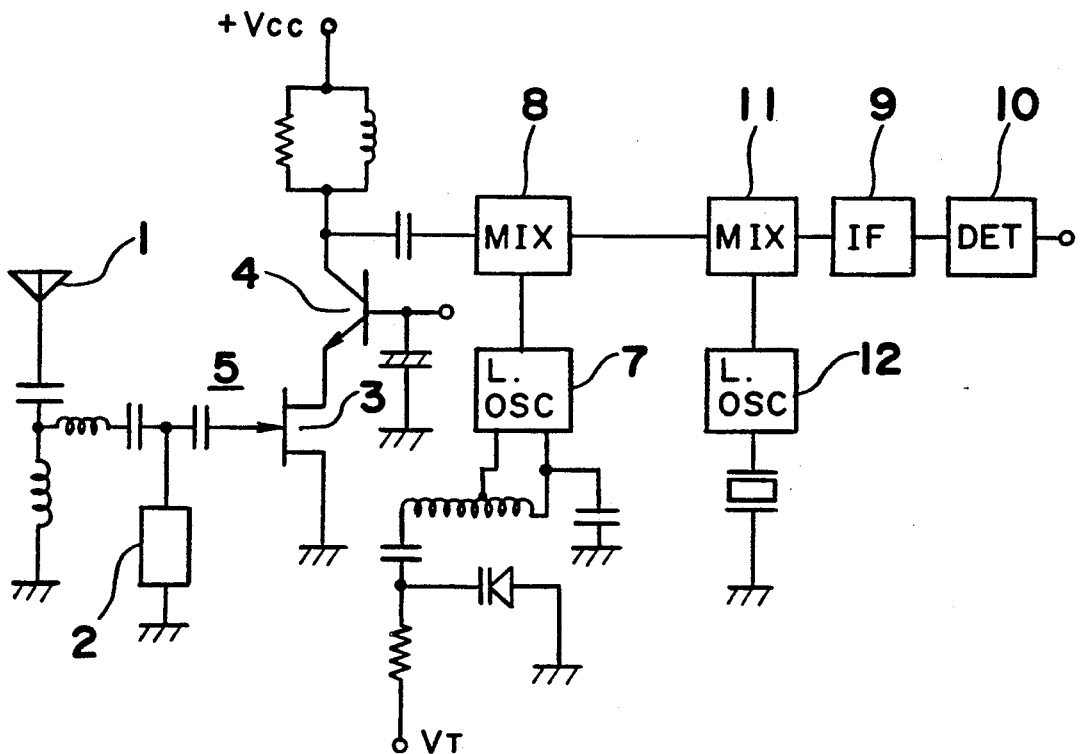

Referring to FIG. 1 a block diagram of a preferred embodiment of the present invention is shown. Reference number 13 is the antenna for receiving the broadcast wave; 14 is an RF amplifier including an FET 15 for amplifying an RF signal, and an AGC transistor 16 for effecting the automatic gain control (AGC) of the RF signal; 17 is an RF tuning circuit connected to the collector of the AGC transistor 16; 18 and 19 are a coil and resistor, respectively, connected parallel to each other and between the RF tuning circuit 17 and power supply (+Vcc); 20 is a first RF output terminal connected via a capacitor 22 to the intermediate tap of the secondary coil 21 serving as a part of the RF tuning circuit 17; 23 is a second RF output terminal connected to one end of the coil 18 via capacitor 24; 25 is a selector which selects one of the RF output signals obtained at the first and second RF output terminals 20 and 23 through taps Ta and Tb, respectively; 26 is a first local oscillator; 27 is a first mixing circuit which mixes the RF output signal from the selector, 25 and the output signal from the first local oscillator 26 and generates a first IF signal of 10.7 MHz; 28 is a second local oscillator; 29 is a second mixing circuit which mixes the first IF signal and the output signal from the second local oscillator 28 and generates a second IF signal of 450 kHz; 30 is an IF amplifier which amplifies the second IF signal; and 31 is an AM detector which detects the amplified IF signal by the amplitude demodulation.

Furthermore, 32 is a PLL circuit which defines the tuning frequency of the RF tuning circuit 17 and the oscillation frequency of the first local oscillator 26; 33 is an automatic channel selection detector which detects whether or not the PLL circuit 32 is in an automatic tuning state and generates a control signal to switch the selector 25 accordingly; 34 is a D/A convertor which converts the digital tuning signal obtained from the PLL circuit 32 to an analog signal which is applied to the RF tuning circuit 17 through a low pass filter 45; 35 is a field strength detector which detects the field strength of the reception signal; and 36 is an A/D convertor which converts the analog signal indicating the field strength from the field strength detector 35 to a digital signal.

The operation of this AM radio receiver is described hereinbelow. The RF signal received at the antenna 13 is applied to the FET 15 gate through a capacitor 37, and is amplified by the FET 15. The amplified RF signal passes the emitter-collector path of the AGC transistor 16, and is in turn taken out from the RF tuning circuit 17 and further applied to the first RF output terminal 20.

Because the tuning frequency of the RF tuning circuit 17 is determined by the secondary coil 21, variable capacity diode 38, and capacitor 39, the RF signal obtained at the first RF output terminal 20 is a tuned signal and is a narrow band signal. Thus, the signal obtained from terminal 20 is referred to as a narrow band RF signal.

Furthermore, the RF signal obtained at the collector of the AGC transistor 16 is taken out by the parallel circuit of coil 18 and resistance 19 as an untuned signal, and further applied to the second RF output terminal 23. This RF signal has an extremely wide band width because it is not band width restricted. Thus, the signal obtained from terminal 23 is referred to as a wide band RF signal.

When an automatic tuning button (not shown) on the AM radio receiver is pressed for effecting the automatic channel selection, the PLL circuit 32 will enter an automatic tuning state, and channel selection will begin. Automatic channel selection by the PLL circuit 32 varies the oscillation frequency of the first local oscillator 26 according to the output signal of the PLL circuit 32, and stops variation of the oscillation frequency when a station is detected. This method is disclosed, for example, in U.S. Pat. No. 4,048,570 to Yasuaki SUMI issued Sept. 13, 1977, and therefore, a further description therefor is omitted.

When the PLL circuit 32 enters the automatic tuning channel selection mode, the automatic channel selection detector 33 detects the automatic tuning channel selection mode and thus provides HIGH level signal to the selector 25. Thus, the selector 25 enters a first mode, so that the wide band RF signal obtained at the second RF output terminal 23 is applied to the first mixing circuit 27. The first mixing circuit 27 mixes the wide band RF signal and the output signal of the first local oscillator 26, and generates a first IF signal of 10.7 MHz. At this time, the output signal frequency of the first local oscillator 26 is determined according to the control signal applied to the first resonator 41 through a low pass filter 40 from the PLL circuit 32, and the control signal changes continuously according to the interstation frequency during automatic channel selection.

The output IF signal from the first mixing circuit 27 is applied to the second mixing circuit 29 through the IF tuning circuit 42, and is mixed with the output signal of the second local oscillator 28. The 450-kHz second IF signal output from the second mixing circuit 29 is amplified by the IF amplifier 30 including an IF tuning circuit, and is detected by the AM detector 31. Therefore, an AM detected signal of the reception signal is produced from the output terminal 43, and is further applied to the following stage.

Thereafter, when the value of the PLL circuit 32 produces a specified value and thus the first local oscillator 26 outputs an oscillation signal with a specified frequency, the 10.7 MHz first IF signal is produced from the first mixing circuit 27. The 10.7 MHz first IF signal passes through the IF tuning circuit 42 and is applied to the second mixing circuit 29.

Because the level of the first IF signal is proportional to the field strength of the reception signal, it is possible to detect the field strength of the reception signal. To this end, the first IF signal is applied to the field strength detection circuit 35. Accordingly, the field strength detection circuit 35 generates a field strength signal indicative of the field strength of the received signal and is applied to a stop signal generator 44.

In the stop signal generator 44, the field strength signal is compared with a reference voltage. If the field strength signal is greater than the reference voltage, meaning that the received signal has a strong field strength, a stop signal is produced from the stop signal generator 44. The stop signal is applied to the PLL circuit 32 which thereupon stops the channel selection operation. If the output signal is less than the reference voltage, the stop signal is not generated. Thus, PLL circuit 32 changes the value of the output control signal to search and receive the next station.

It is to be noted that in the automatic channel selection state, the D/A convertor 34 is initialized and the tuning frequency of the RF tuning circuit 17 is set outside the band width to prevent narrow band IF signals from adversely affecting the receiver.

When a station is selected and received by the automatic channel selection operation, the output signal of the stop signal generator 44 causes the PLL circuit 32 to stop changing level of the output signal. Thus, tuned state of the receiver is fixed to receive the selected frequency. Furthermore, since automatic tuning of the PLL circuit 32 has stopped, the automatic channel selection detector 33 produces a LOW level signal. Thus, the selector 25 is switched to a second mode wherein the narrow band RF signal from the first RF output terminal 20 is selected.

When the automatic tuning operation of the PLL circuit 32 stops, PLL circuit 32 produces a digital control signal, for example a 4-bit digital control signal, that defines the tuning frequency of the RF tuning circuit 17. The digital control signal from the PLL circuit is applied to the D/A convertor 34 for the conversion to an analog signal. The analog signal is applied to the RF tuning circuit 17 through a low pass filter 45, so that the tuning frequency of the RF tuning circuit 17 is roughly tuned to the RF signal frequency of the currently received station. After that, the tuning frequency of the RF tuning circuit 17 is fine-tune controlled by a fine tuning circuit 46.

Fine tuning circuit 46 generates, for example, a 6-bit digital signal, which automatically and sequentially changes step-by-step. Thus, 64 variations of a digital signal are sequentially generated from the fine tuning circuit 46. The 6-bit digital signal and the 4-bit digital control signal from the PLL circuit 32 are added and converted to an analog signal in the D/A convertor 34. The converted analog signal is applied to the RF tuning circuit It is to be noted that in this case, the digital signal from the PLL circuit 32 is added as the upper four bits, and the digital signal from the fine tuning circuit 46 is added as the lower six bits, so that the digital signal from the PLL circuit 32 is weighted more.

The tuning frequency of the RF tuning circuit 17 is varied according to the analog signal generated from the D/A convertor 34, and the output signal level of the field strength detection circuit 35 varies accordingly. The output signal from the field strength detection circuit 35 is converted to a digital signal by the A/D convertor 36, and in turn applied to memory 47. Memory 47 has 64 storing addresses for storing 64 different field strength digital signals in response to each increment of the 6-bit signal in the fine tuning circuit 46. Thus, the digital output signals from the A/D convertor 36 are each stored in one of the 64 addresses in the memory 47.

When all the addresses in memory 47 are stored with digital signals, the fine tuning circuit 46 stops changing the output signal, and at the same time, a maximum value comparator 48 determines which of the digital signals stored in the memory 47 is the greatest. By this operation, of all the fine tuning frequencies of the RF tuning circuit 17, a tuned frequency at which the maximum output signal is obtained is selected. When the maximum is selected, the maximum value comparator 48 controls the fine tuning circuit 46 to produce the 6-bit digital signal corresponding to the maximum value. Thus, the tuning frequency of the RF tuning circuit 17 is fixed to a specified value, and the AM radio receiver is set to the optimum tuning position.

Figure 4:
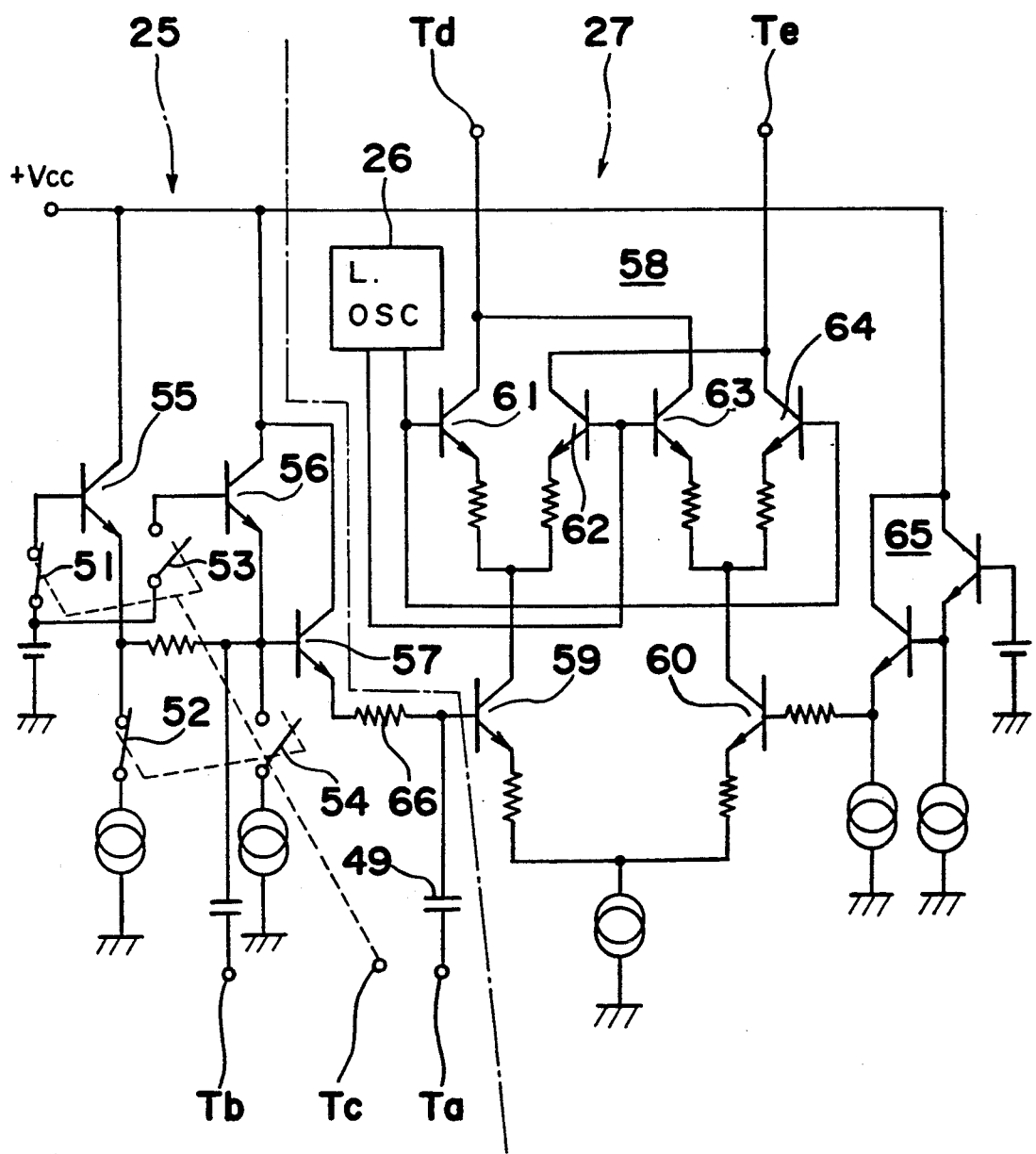
FIG. 4 is a block diagram showing a detail of a first switching circuit and first mixing circuit employed in the circuit of FIG. 1.

Referring to FIG. 4 is a circuit diagram is shown which is an example of the selector 25 and the first mixing circuit 27 shown in FIG. 1. Reference character Ta is a first input terminal to which is applied the narrow band RF signal from terminal 20 shown in FIG. 1, Tb is a second input terminal to which is applied the wide band RF signal from terminal 23, and Tc is a third input terminal to which is applied the signal from the automatic channel selection detector 33.

Reference numbers 51, 52, 53 and 54 are switches controlled simultaneously by the signal from the automatic channel selection detector 33. More specifically, first and second switches 51 and 52 are turned on during the automatic tuning state, and third and fourth switches 53 and 54 are turned on when a station is turned. Reference numbers 55, 56, and 57 are first, second, and third switching transistors which operate in accordance with the switching of the switches 51-54. As will be described in detail later, the selector 25 produces the RF signal from a junction between resistor 66 and capacitor 49.

The first mixing circuit 27 comprises a mixer 58 including first through sixth mixing transistors 59-64, and a bias circuit 65 which applies a bias voltage to the base of the second mixing transistor 60. The first mixing circuit 27 mixes the RF signal applied to the base of the first mixing transistor 59 and the local oscillation signal applied from the first local oscillator 26 to the base of the third through sixth mixing transistors 61-64, and produces from output terminals Td and Te the 10.7 MHz first IF signal which is applied to the IF tuning circuit 42 and further to the second mixing circuit 29.

In operation, when the AM radio receiver is in the automatic tuning mode, first and second switches 51 and 52 are turned on and the third and fourth switches 53 and 54 are turned off, as shown in FIG. 4. Thus, the third switching transistor 57 is biased by the first switching transistor 55, and the wide band RF signal applied to the second input terminal Tb is applied to the base of the first mixing transistor 59 through the base-emitter of the third switching transistor 57 and resistor 66.

As described with reference to FIG. 1 above, because the tuning frequency of the RF tuning circuit 17 is set outside the tuning frequency, the narrow band RF signal is attenuated approximately 40 dB and has no affect on the circuit operation. Therefore, the wide band RF signal and the output signal of the first local oscillator 26 are mixed in the first mixer 58 during the automatic tuning mode.

Next, when the AM radio receiver is in a tuned state, the first and second switches 51 and 52 are turned off, and the third and fourth switches 53 and 54 are turned on. Thus, the second switching transistor 56 becomes on, and the wide band RF signal applied to the second input terminal Tb is attenuated approximately 40 dB by the low emitter impedance of the second switching transistor 56. Therefore, the narrow band RF signal applied to the first input terminal Ta is applied to the base of the first mixing transistor 59, and the narrow band RF signal and the output signal of the first local oscillator 26 are mixed in the first mixer 58.

As described hereinabove, an AM radio receiver according to the present invention can eliminate tracking error because automatic tuning can be accomplished using the wide band RF signal. Furthermore, when tuned, interference characteristics, including mixing modulation interference, can be greatly improved because a narrow band RF signal is used. In addition, because station tuning is accomplished using both a rough tuning signal and a fine tuning signal, more precise tuning is possible.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An AM radio receiver which receives a radio frequency signal comprising:
   an automatic seeking circuit means for setting an automatic signal seeking mode and for producing a first signal indicative of automatic tuning thereof and a second signal indicative of a signal receiving mode;
   radio frequency circuit means for producing in response to the received signal a tuned signal of a fixed frequency band and an untuned signal;
   selector means for receiving said tuned signal and said untuned and responsive to the output of said signal seeking means for selecting said tuned signal when said second signal is produced from said automatic seeking circuit and selecting said untuned signal when said first signal is produced, and producing a selected signal; and
   intermediate frequency signal generating means for producing an intermediate frequency signal based on the selected signal.

2. An AM radio receiver as claimed in claim 1, further comprising:
   field strength detecting means for detecting the field strength of the received signal; and
   fine tuning means having an output thereof connected to said radio frequency circuit means for effecting a tuning in said radio frequency circuit in compliance with the detected field strength so as to terminate fine tuning when the output signal of the field strength detecting means is maximum.

3. An AM radio receiver as claimed in claim 2, wherein said fine tuning means comprises:
   fine tuning position setting means for sequentially and finely changing the tuned frequency of said radio frequency circuit means;
   memory means for storing a signal indicative of the field strength in response to each change of the tuned frequency; and
   maximum selecting means for selecting the maximum of the stored field strength signal and for reading the fine tuned position corresponding to said maximum of the stored field strength signal, whereby said radio frequency circuit means is finely toned to a condition providing the maximum field strength signal.

4. An AM radio receiver as claimed in claim 2, wherein said fine tuning means further comprises:
   a D/A convertor for digital-to-analog converting a rough frequency information signal obtained from said automatic seeking circuit, converting a fine frequency information signal obtained from said fine tuning means and applying the converted signal to said radio frequency circuit.

5. An AM radio receiver as claimed in claim 1, wherein said intermediate frequency signal generating means comprises:
   a first mixing means for mixing said selected signal from said selector means and a first oscillation signal from a first local oscillation circuit and for producing a first intermediate frequency signal; and
   a second mixing means for mixing said first intermediate frequency signal and a second oscillation signal from a second local oscillation circuit and for producing a second intermediate frequency signal.

6. An AM radio receiver as claimed in claim 1, wherein said radio frequency circuit means comprises:
   an FET for amplifying the received signal;
   AGC circuit means including a transistor connected in cascade to said FET; and
   first and second loads serially connected to a collector of said transistor, said first load inductively connected to said radio frequency circuit means to produce said tuned signal, and said second load connected to said first load to produce said untuned signal.

* * * * *

UNITED STATES PATENT AND TRADEMARK OFFICE
CERTIFICATE OF CORRECTION

PATENT NO. : 5,203,031

DATED : April 13, 1993

INVENTOR(S) : SAKAE SUGAYAMA

It is certified that error appears in the above-identified patent and that said Letters Patent is hereby corrected as shown below:

Column 7:

Claim 1, line 5, change "tuning" to -- seeking --.

Signed and Sealed this

Fourteenth Day of December, 1993

*Attest:*

BRUCE LEHMAN

*Attesting Officer*   *Commissioner of Patents and Trademarks*